(12) United States Patent
Grudowski et al.

(10) Patent No.: US 7,736,957 B2
(45) Date of Patent: Jun. 15, 2010

(54) METHOD OF MAKING A SEMICONDUCTOR DEVICE WITH EMBEDDED STRESSOR

(75) Inventors: Paul A. Grudowski, Austin, TX (US); Veeraraghavan Dhandapani, Round Rock, TX (US); Darren V. Goedeke, Pflugerville, TX (US); Voon-Yew Thean, Fishkill, NY (US); Stefan Zollner, Hopewell Junction, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 285 days.

(21) Appl. No.: 11/756,095

(22) Filed: May 31, 2007

(65) Prior Publication Data
US 2008/0299724 A1    Dec. 4, 2008

(51) Int. Cl.
*H01L 21/00* (2006.01)
*H01L 21/84* (2006.01)
(52) U.S. Cl. .................. 438/153; 438/154; 257/E21.63
(58) Field of Classification Search .................. 438/153, 438/154, 199; 257/19
See application file for complete search history.

(56) References Cited

U.S. PATENT DOCUMENTS

2004/0262694 A1    12/2004  Chidambaram
2006/0228842 A1    10/2006  Zhang et al.
2007/0012913 A1*    1/2007  Ohta et al. ..................... 257/19
2008/0173941 A1*    7/2008  Zhu et al. ..................... 257/344

* cited by examiner

*Primary Examiner*—Phat X Cao
*Assistant Examiner*—Nga Doan
(74) *Attorney, Agent, or Firm*—James L. Clingan, Jr.; Daniel D. Hill

(57) ABSTRACT

A method for forming a semiconductor device includes providing a semiconductor substrate; forming a gate dielectric over the semiconductor substrate; forming a gate electrode over the gate dielectric; forming an insulating layer over a sidewall of the gate electrode; defining source and drain regions in the semiconductor substrate adjacent to the insulating layer; implanting a dopant in the source and drain regions of the semiconductor substrate to form doped source and drain regions; forming a sidewall spacer adjacent to the insulating layer; forming a recess in the semiconductor substrate in the source and drain regions, wherein the recess extends directly underneath the spacer a predetermined distance from a channel regions; and forming a stressor material in the recess. The method allows the stressor material to be formed closer to a channel region, thus improving carrier mobility in the channel while not degrading short channel effects.

19 Claims, 4 Drawing Sheets

METHOD OF MAKING A SEMICONDUCTOR DEVICE WITH EMBEDDED STRESSOR

BACKGROUND

1. Field

This disclosure relates generally to semiconductor devices, and more specifically, to semiconductor devices with embedded stressors.

2. Related Art

Embedded stressors have been found to be effective in increasing transistor performance by increasing carrier mobility. The typical process includes forming recesses in the source/drain regions and then filling the recesses with a semiconductor material that acts as a stressor to provide stress to the channel while also being effective as a source/drain. For the channel being silicon, the use of silicon germanium stressors has been found to be effective for the P channel transistors and silicon carbon has been found to be effective for N channel transistors. To increase stress and thereby increase transistor performance, the stressors are desirable adjacent to the channel. Thus a benefit of the stressors being immediately adjacent to the channel is maximizing the stress to the channel. The cost of this benefit can be increased leakage due to loss of short channel control if the stressors continue straight down from the lateral edge of the channel. Thus, a benefit is seen in attempting to provide a stressor that is shallow in the area immediately adjacent to the channel to and is deep in the area where the source/drain contact is formed. This then brings the stressor adjacent to the channel to increase transistor performance while not degrading current leakage. This can be achievable but has been found to add processing complexity.

Accordingly there is a need to achieve the benefits of embedded stressors while avoiding or reducing the problems associated with making them.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a source/drain and extension region is formed by implanting into a semiconductor layer using a gate and an offset spacer as a mask. The implant has the affect of altering the etch characteristic of the portion of the semiconductor that receives the implant. The result is that the source/drain and extension region has a different etch characteristic from the semiconductor layer in which it is formed. A sidewall spacer is formed around the gate. A source/drain contact region is recessed with a first etchant using the sidewall spacer as a mask. The source/drain extension region is recessed using a second etchant that etches the extension region selectively over the semiconductor layer due to the different doping concentrations in the two regions. The second etch thus leaves a recess under the sidewall spacer. The recess is then filled with a stressor. This also partially fills the recess of the source/drain region. The recess is then completely filled with stressor material that can be of a different in-situ doping concentration from what filled the source/drain extension region. This is better understood by reference to the drawings and the following description.

Figure 1:
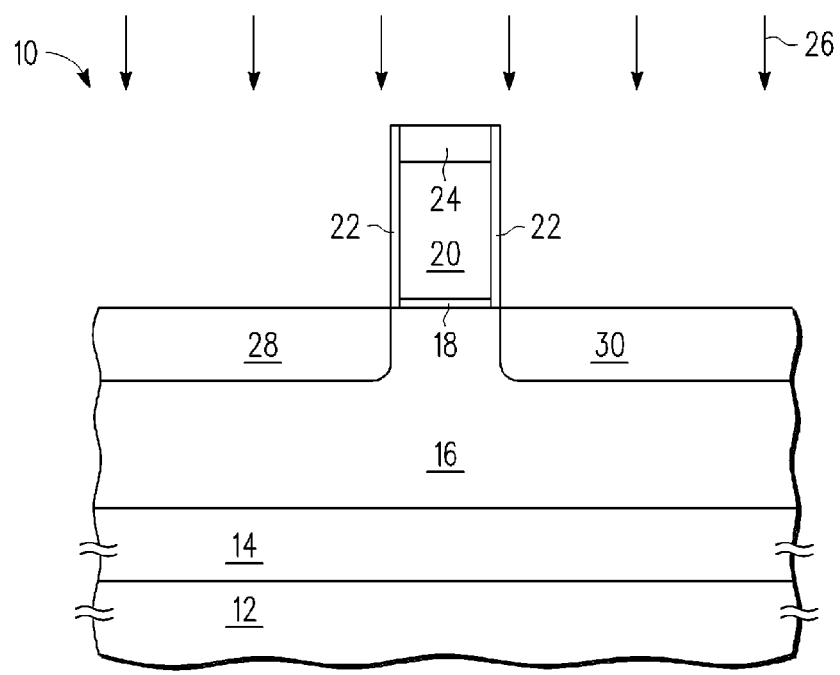
FIG. 1 is a cross section of a semiconductor device at a stage in processing according to one embodiment.

Shown in FIG. 1 is a semiconductor device 10 comprising a substrate 12, an insulating layer 14 over substrate 12, a semiconductor layer 16 over insulating layer 14, a gate dielectric 18 over a portion of semiconductor layer 16, gate electrode 20 over gate dielectric 18, an insulating layer 24 over gate electrode 20, a sidewall spacer 22 around gate electrode 20, and source/drain and extension regions 28 and 30 in semiconductor layer 16 formed by an implant 26 using gate electrode 20 as a mask. Substrate 12 is for providing physical support for semiconductor device 10 and may be silicon. Insulating layer 14 provides insulation between substrate 12 and semiconductor layer 16 and may be silicon oxide. Semiconductor layer 16 is for use in forming transistors and potentially other devices and may be silicon. Substrate 12, insulating layer 14, and semiconductor layer 16 together form a semiconductor-on-insulator (SOI) substrate. A bulk substrate may be used instead. Gate dielectric 18 is very thin, such as 20 Angstroms, compared to all of the other layers and may be silicon oxide. Gate electrode can be doped polysilicon but could be a stack of materials, especially one or more metal layers and may or may not further include polysilicon. Insulating layer 24 may be silicon nitride. Sidewall spacer 22, which may be silicon oxide or silicon nitride, is relatively thin for a sidewall spacer, about 100 Angstroms, and is for protecting the sidewall of gate electrode 20 and providing a small offset of the source/drain and extensions 28 and 30 from the edge of gate electrode 20. Implant 26 can be a conventional source/drain extension implant using arsenic for the case of an N channel transistor. Implant 26, in this case, is for changing the etch characteristic for source/drain and extension regions 28 and 30 from that of semiconductor layer 16. That a conventional source/drain extension implant can be used to achieve this is a benefit in that standard processing can be used. In this example of semiconductor layer 16 being silicon, arsenic doping changes the etch characteristic so that arsenic-doped silicon, with the properly selected etchant, can be etched selective to silicon that has not been arsenic doped. Source/drain extensions 28 and 30 are only doped to a depth of about a third of the width of gate electrode 20 which corresponds to the channel length but can be adjusted to optimize the extension recess depth.

Figure 2:
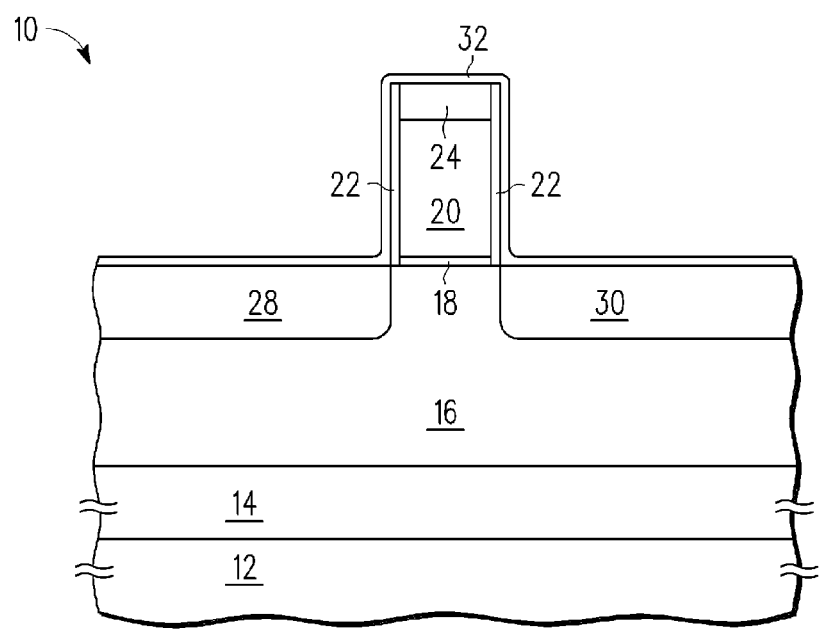
FIG. 2 is a cross section of the semiconductor device of FIG. 1 at a subsequent stage in processing.

Shown in FIG. 2 is semiconductor device 10 after forming an insulating layer 32 over gate electrode 20 and source/drain extension regions 26 and 28. In a typical integrated circuit, transistor of both P and N type would be formed. This example is for N-type but is applicable to P channel transistors as well. Insulating layer 32 would be formed over the P channel transistors as well as shown for the N channel transistor.

Figure 3:
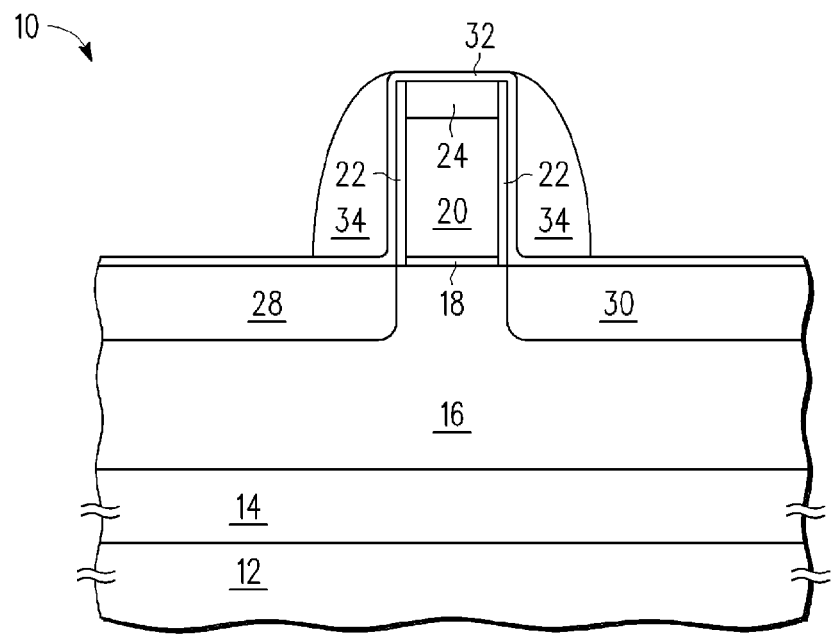
FIG. 3 is a cross section of the semiconductor device of FIG. 2 at a subsequent stage in processing.

Shown in FIG. 3 is semiconductor device 10 after forming a sidewall spacer 34 around gate electrode 20. Sidewall spacer 34, at the widest point, is about the same as the width of gate electrode 20 but can be thicker or thinner to adjust the final length of a stressor yet to be formed in the source/drain extension portion of regions 28 and 30. Sidewall spacer may be silicon nitride.

Figure 4:
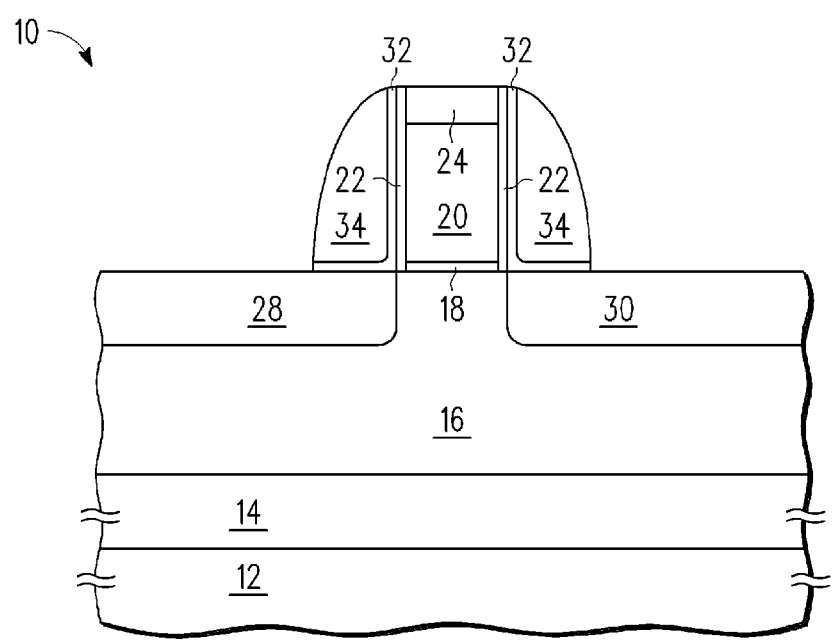
FIG. 4 is a cross section of the semiconductor device of FIG. 3 at a subsequent stage in processing.

Shown in FIG. 4 is semiconductor device 10 after removing insulating layer 32 in the areas not covered by sidewall spacer 34. For the other type of transistors, which are not shown, insulating layer 32 would not be removed.

Figure 5:
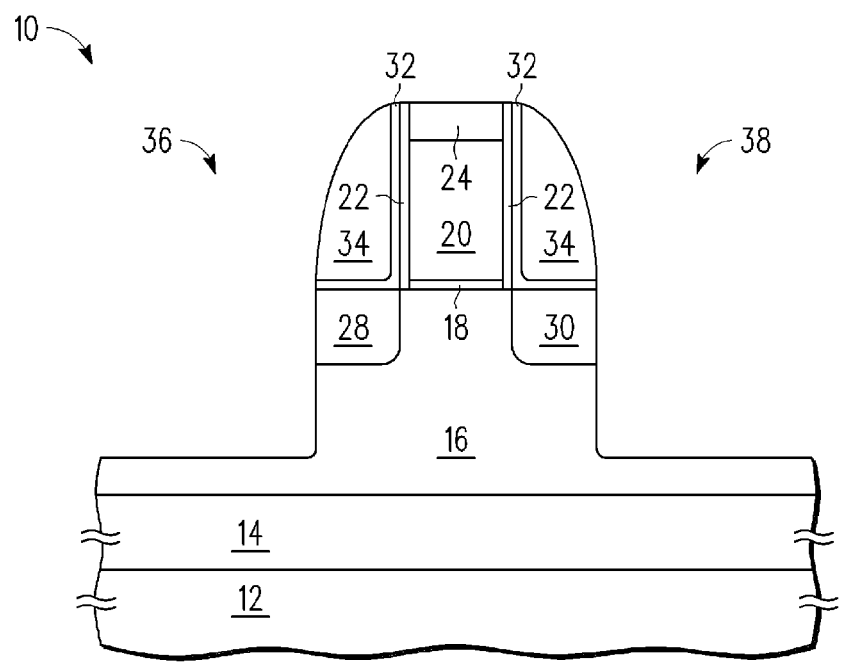
FIG. 5 is a cross section of the semiconductor device of FIG. 4 at a subsequent stage in processing.

Shown in FIG. 5 is semiconductor device 10 after etching semiconductor layer 16 using sidewall spacer 34 and insulating layer 24 as a mask to leave a recess 36 for one source/drain contact region and a recess 38 for another source/drain contact region on an opposing side of gate electrode 20 from that of recess 36. An effective etchant for etching through arsenic-doped silicon and undoped silicon is sulfur hexafluoride with parameters that cause the etch to be anisotropic. For this example of sulfur hexafluoride, the etch is a dry plasma etch using a bias source. Other anisotropic etches may also be used. Nitrogen trifluoride in the presence of chlorine is one example. Another example is hydrogen bromide in the presence of chlorine. Oxygen may also be an effective component of the etch chemistry. In this case undoped silicon means a doping level below 1 e 18 (one times ten to the eighteenth) atoms per cubic centimeter. Doped means in excess of a doping level of greater than 1 e 19 atoms per cubic centimeter. Carrier gases include argon and helium and others may also be effective. It is preferable that the difference between doped and undoped concentrations be at least a factor of about one hundred. Remaining portions of source/drain extension regions 28 and 30 remain under sidewall spacer 34.

Figure 6:
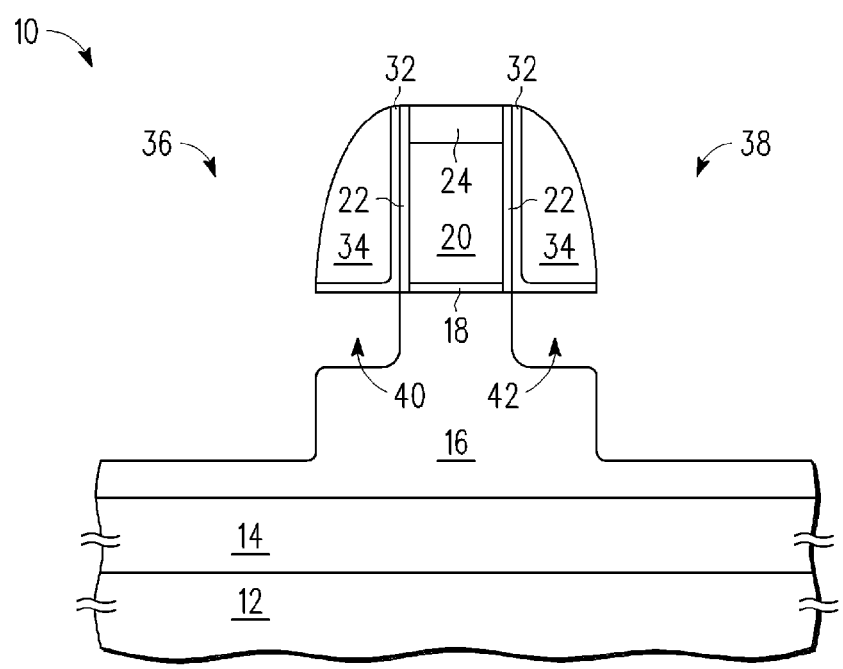
FIG. 6 is a cross section of the semiconductor device of FIG. 5 at a subsequent stage in processing.

Shown in FIG. 6 is semiconductor device 10 after changing the etch conditions to remove the remaining portions of source/drain extension regions 28 and 30 to leave recesses 40 and 42, respectively. Disabling the bias source is effective in converting the etch to an isotropic etch. With the etch being isotropic, the remaining portions of source/drain extension regions 28 and 30 etch much faster than semiconductor layer 16. This etch can be more tightly controlled and the selectivity can be somewhat tuned by controlling the concentration of the sulfur hexafluoride. Thus the selective etch of the remaining portions of source/drain extension regions 28 and 30 can be achieved with a change in etch conditions of turning off the bias power and diluting the sulfur hexafluoride with an increase in the inert carrier gas. The etch that forms recesses 36 and 38 is different than the etch that forms recesses 40 and 42 but it can also be viewed as a continuous etch because the two different conditions for the two etches do not require any delay or removal of semiconductor device 10 from the etch chamber. Even a change in the active reactant may not require any delay in the etching. Such a change may not require a change in the etch equipment.

An alternative is for the second etch to be performed in a tool in which epitaxial growth can be performed. This can be done with minimal change, if any, to currently available equipment because the second etch does not require a bias power. Thus, the isotropic etch can be performed in a chamber that is also capable of performing epitaxial growth. In such case, the subsequent epitaxial growth can be done in situ following the second etch.

Figure 7:
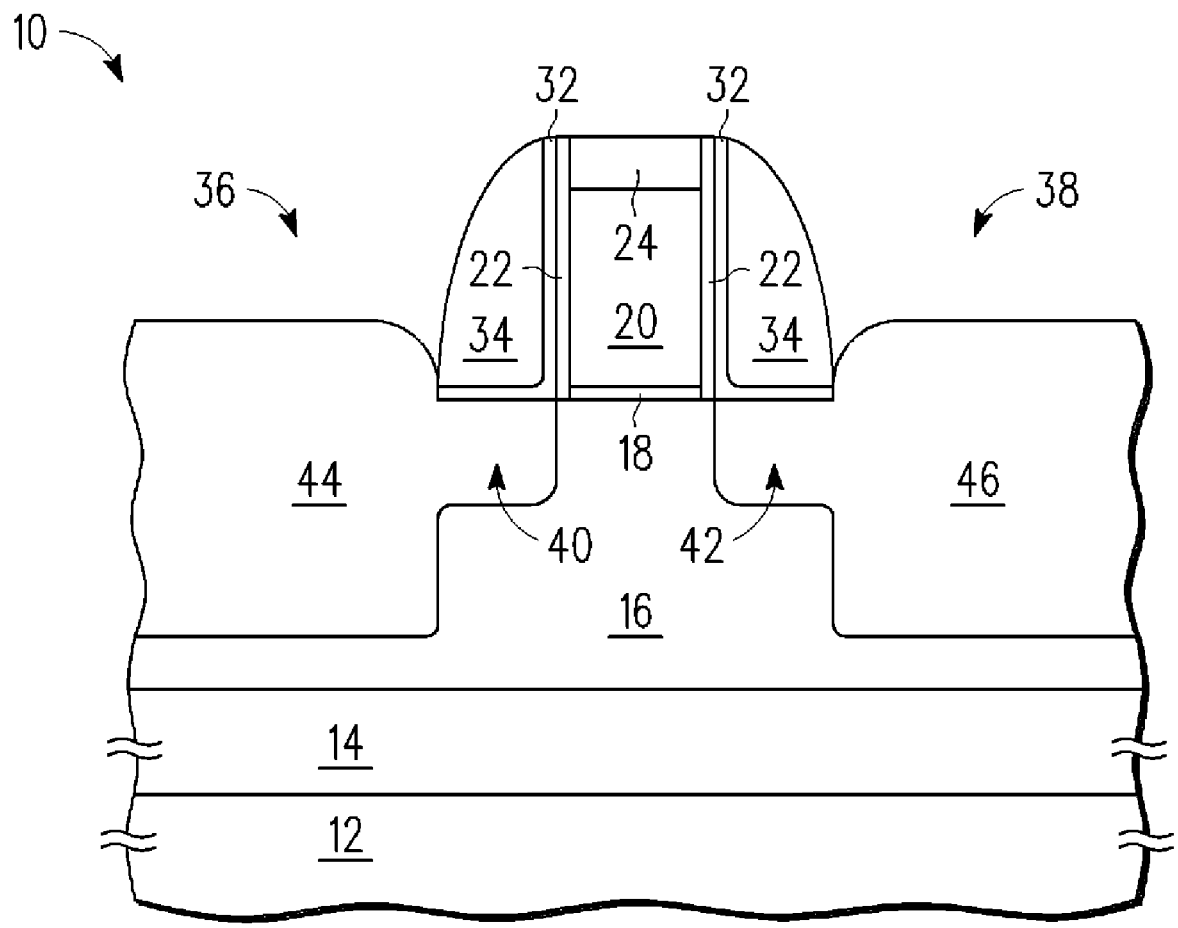
FIG. 7 is a cross section of the semiconductor device of FIG. 6 at a subsequent stage in processing.

Shown in FIG. 7 is semiconductor device 10 after epitaxially growing source/drain region 44 in recesses 36 and 40 and source/drain region 46 in recesses 42 and 46. Source/drain regions 44 and 46 also are stressors that are, for this described case of N-type, formed from silicon carbon that are in situ doped with phosphorus in that they are doped as they are grown. Being silicon carbon, they provide a tensile stress to the channel, the region between source/drain regions 44 and 46 immediately under gate 20. Semiconductor device 10 of FIG. 7 is a functional transistor. Subsequent processing would typically include siliciding source/drain regions 44 and 46 and forming overlying interconnect layers. Other fills for different stresses can be silicon germanium (SiGe) or even silicon, germanium, and carbon (SiGeC).

As an option, the phosphorus doping concentration of source/drain regions 44 and 46 can be changed after the extension recesses 40 and 42 have been filled. In such case the region of recesses 40 and 42 can have a doping concentration selected for the purpose of being source/drain extensions and the region for making contact to source/drain regions 44 and 46 can have a doping concentration selected for the purpose of siliciding and making electrical contact. This staged doping is also applicable for the reverse case of forming a P channel transistor with silicon germanium stressors that are compressive as source/drain regions 44 and 46. In the case of P channel transistors, source/drain regions 44 and 46 would be in situ boron doped instead of phosphorus. Also for the N channel case, arsenic may be used as the dopant.

The resulting structure, which requires minimal increased processing complexity, has the desired stressor immediately adjacent to the channel but spaced back at the lower depth. Thus, the current leakage issues that arise from the source/drain being to close at the lower depths does not arise.

By now it should be appreciated that there has been provided a method for forming a semiconductor device that includes providing a semiconductor substrate, forming a gate dielectric, forming a gate electrode, forming an insulating layer, defining source and drain regions, implanting a dopant, forming a sidewall spacer, forming a recess, and forming a stressor material. The gate dielectric is formed over the semiconductor substrate. The gate electrode is over the gate dielectric. The insulating layer is over the sidewall of the gate electrode. The source and drain regions are in the semiconductor substrate adjacent to the insulating layer. The dopant is in the source and drain regions of the semiconductor substrate to form doped source and drain regions. The sidewall spacer is adjacent to the insulating layer. The recess is in the semiconductor substrate in the source and drain regions. The recess extends directly underneath the spacer a predetermined distance from a channel region. The stressor material is in the recess. The implanting the dopant in the source and drain regions may further comprise implanting one of arsenic, phosphorus, boron, oxygen, carbon, nitrogen, or boron difluoride in the source and drain regions. The forming the recess in the semiconductor substrate may further comprise isotropically etching the doped source and drain regions. The forming the stressor material in the recess may further comprise epitaxially growing silicon carbon (SiC), silicon germanium (SiGe), or a combination of silicon, carbon, or germanium (SiGeC) in the recess. The forming the stressor material in the recess may comprise growing a first stressor layer in the recess and growing a second stressor layer over the first stressor layer. The forming the recess may further comprises performing first and second etch processes. The first etch process removes a first portion of the recess adjacent to the sidewall spacer. The second etch process removes a second portion of the recess directly underneath the sidewall spacer. The second etch process may be performed in-situ with forming the stressor material. The second etch process may be performed using process gases selected from a group comprising HBr, $SF_6$, $NF_3$, $Cl_2$, O2, Ar, and He. A thickness of the insulating layer may determine the predetermined distance. The forming the stressor material may further comprise providing one of either a tensile stress or a compressive stress on the channel region of the semiconductor device. The forming the stressor material in the recess may comprise growing first and second stressor layers. The first stressor layer is formed with a first in-situ doping concentration in the recess. The second stressor layer is formed with a second in-situ doping concentration over the first stressor layer. The forming a stressor material may further comprise growing the stressor material on exposed silicon in the recess. The forming a stressor material may further comprise growing the stressor material over the semiconductor device, selectively etching the stressor material from the gate electrode and the spacer, and repeating the growing and etching a predetermined number of times.

Also there is described a method for forming a semiconductor device. A semiconductor substrate is provided. A gate dielectric is formed over the semiconductor substrate. A gate electrode is formed over the gate dielectric. A capping layer is formed over the gate electrode. An offset spacer is formed over a sidewall of the gate electrode and the capping layer. A dopant in source and drain regions of the semiconductor substrate is implanted adjacent to the offset spacer to form doped source and drain regions. A sidewall spacer is formed adjacent to the offset spacer. A recess is formed in the semiconductor substrate in the source and drain regions. The recess extends directly underneath the sidewall spacer a predetermined distance from a channel region, the predetermined distance determined by a thickness of the offset spacer. A stressor material is formed in the recess. The forming the stressor material may further comprise forming one of either a first stressor material or a second stressor material in the recess, the first stressor material comprising silicon carbon (SiC) for providing tensile stress for the channel region being of an N-channel transistor, and the second stressor material comprising silicon germanium (SiGe) for providing compressive stress for the channel region being of a P-channel transistor. The forming the recess may further comprise performing a first etch process to remove a first portion of the recess adjacent to the sidewall spacer and performing a second etch process to remove a second portion of the recess directly underneath the sidewall spacer. The second etch may be performed in-situ with forming the stressor material. The second etch may be performed using process gases selected from a group comprising HBr, $SF_6$, $NF_3$, $Cl_2$, $O_2$, Ar, and He.

Yet also described is a method for forming a semiconductor device. A semiconductor substrate is provided. A gate dielectric is formed over the semiconductor substrate. A gate electrode is formed over the gate dielectric. A capping layer is formed over the gate electrode. An offset spacer is formed over a sidewall of the gate electrode and the capping layer. A dopant is implanted in source and drain regions of the semiconductor substrate adjacent to the offset spacer to form doped source and drain regions. A sidewall spacer is formed adjacent to the offset spacer. A recess is formed in the semiconductor substrate in the source and drain regions using a first etch process and a second etch process. The recess extends directly underneath the sidewall spacer a predetermined distance from a channel region. The predetermined distance is determined by a thickness of the offset spacer. The first etch process is for removing a first portion of the recess adjacent to the sidewall spacer and the second etch process is for removing a second portion of the recess directly underneath the sidewall spacer. The forming the stressor material may further comprise providing one of either a tensile stress or a compressive stress on a channel region of the semiconductor device. The second etch process may be performed in-situ with forming the stressor material. The second etch process may be performed using process gases selected from a group comprising HBr, $SF_6$, $NF_3$, $Cl_2$, $O_2$, Ar, and He.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the implant for changing the etch characteristic is described as being also useful as a source/drain dopant that is not necessarily required. Because the area receiving the implant is subsequently removed, it may be preferably to implant with a different element that causes a change in the etch characteristic. Other examples to consider for this include but are not limited to phosphorus, boron, oxygen, carbon, nitrogen, and boron difluoride. It may also be preferable for the purpose of etch optimization for the implant to be self-amorphizing and to then leave the implanted region in an amorphous state prior to performing the recess etch. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device comprising:
   providing a semiconductor substrate;
   forming a gate dielectric over the semiconductor substrate;
   forming a gate electrode over the gate dielectric;
   forming an insulating layer over a sidewall of the gate electrode;
   defining source and drain regions in the semiconductor substrate adjacent to the insulating layer;
   implanting a dopant in the source and drain regions of the semiconductor substrate to form doped source and drain regions;
   forming a sidewall spacer adjacent to the insulating layer and over a first portion of the source region and a second portion of the drain region;
   anisotropically etching, in an etch chamber, the source and drain regions including the first and second portions using a plasma etch with an active bias source;
   isotropically etching, in the etch chamber and after anisotropically etching, the source and drain regions using an isotropic etch process achieved by turning off the bias source to form a first recess in the semiconductor substrate in the source region and a second recess in the semiconductor substrate in the drain region, wherein the first recess and the second recess extend underneath the sidewall spacer a predetermined distance from a channel region; and forming a stressor material in the first recess and the second recess including underneath the sidewall spacer.

2. The method of claim 1, wherein implanting the dopant in the source and drain regions further comprises implanting one of arsenic, phosphorus, boron, oxygen, carbon, nitrogen, or boron difluoride in the source and drain regions.

3. The method of claim 1, wherein the anisotropically etching comprises using sulfur hexafluoride and wherein the isotropically etching uses sulfur hexafluoride at a lower concentration than is used in the anistropically etching.

4. The method of claim 1, wherein forming the stressor material in the recess further comprises epitaxially growing silicon carbon (SiC), silicon germanium (SiGe), or a combination of silicon, carbon, or germanium (SiGeC) in the recess.

5. The method of claim 1, wherein forming the stressor material in the recess comprises:
growing a first stressor layer in the recess; and
growing a second stressor layer over the first stressor layer.

6. The method of claim 1, wherein the anistropically etching comprises using hexafluoride and a carrier gas and the isotropically etching comprises using hexafluoride at a lower concentration than is used in the anistropically etching and the carrier gas at a higher concentration than is used in the anistropically etching.

7. The method of claim 6, wherein the isotropically etching is performed in-situ with forming the stressor material.

8. The method of claim 6, wherein the second etch process is performed using process gases selected from a group comprising HBr, $SF_6$, $NF_3$, $Cl_2$, O2, Ar, and He.

9. The method of claim 1 wherein a thickness of the insulating layer determines the predetermined distance.

10. The method of claim 1, wherein forming the stressor material further comprises providing one of either a tensile stress or a compressive stress on the channel region of the semiconductor device.

11. The method of claim 1, wherein forming the stressor material in the recess comprises:
growing a first stressor layer with a first in-situ doping concentration; and
growing a second stressor layer with a second in-situ doping concentration over the first stressor layer.

12. The method of claim 1, wherein forming a stressor material further comprises growing the stressor material on exposed silicon in the recess.

13. The method of claim 1, wherein forming a stressor material further comprises:
growing the stressor material over the semiconductor device;
selectively etching the stressor material from the gate electrode and the sidewall spacer; and
repeating the growing and etching a predetermined number of times.

14. A method for forming a semiconductor device comprising:
providing a semiconductor substrate;
forming a gate dielectric over the semiconductor substrate;
forming a gate electrode over the gate dielectric;
forming a capping layer over the gate electrode;
forming an offset spacer over a sidewall of the gate electrode and the capping layer;
implanting a dopant to a first depth in source and drain regions of the semiconductor substrate adjacent to the offset spacer to form doped source and drain regions;
forming a sidewall spacer adjacent to the offset spacer so that portions of the doped source and drain regions are under the sidewall spacer;
anisotropically etching, in an etch chamber, the semiconductor substrate to a second depth greater than the first depth in the source and drain regions in regions adjacent to the sidewall spacer, wherein the anistropically etching uses sulfur hexafluoride with an active bias source;
isotropically etching, in the etch chamber with the bias source turned off, the portions of the doped regions of the semiconductor substrate under the sidewall spacer using an etchant comprising sulfur hexafluoride that is selective between doped silicon and undoped silicon; and
forming a stressor material comprising a semiconductor material in the source and drain regions.

15. The method of claim 14, wherein forming the stressor material further comprises forming one of either a first stressor material or a second stressor material in the recess, the first stressor material comprising silicon carbon (SiC) for providing tensile stress for the channel region being of an N-channel transistor, and the second stressor material comprising silicon germanium (SiGe) for providing compressive stress for the channel region being of a P-channel transistor.

16. The method of claim 15 wherein the isotropically etching is performed in-situ with forming the stressor material.

17. A method for forming a semiconductor device comprising:
providing a semiconductor substrate;
forming a gate dielectric over the semiconductor substrate;
forming a gate electrode over the gate dielectric;
forming a capping layer over the gate electrode;
forming an offset spacer over a sidewall of the gate electrode and the capping layer;
implanting a dopant in source and drain regions of the semiconductor substrate adjacent to the offset spacer to form doped source and drain regions;
forming a sidewall spacer adjacent to the offset spacer;
forming a recess in the semiconductor substrate in the source and drain regions using a first etch process performed in an etch chamber using an active bias source so that the first process is anisotropic and a second etch process performed in the etch chamber that is isotropic resulting from turning off the bias source, the recess extending directly underneath the sidewall spacer a predetermined distance from a channel region, the predetermined distance being determined by a thickness of the offset spacer, wherein the first etch process removes a first portion of the semiconductor substrate adjacent to the sidewall spacer and the second etch process removes a second portion of the semiconductor substrate, wherein the second portion comprises portions of the doped source and drain regions underneath the sidewall spacer; and
forming a stressor material in the recess, wherein the stressor material comprises a semiconductor material of a composition different from that of the semiconductor substrate.

18. The method of claim 17, wherein forming the stressor material further comprises providing one of either a tensile stress or a compressive stress on a channel region of the semiconductor device.

19. The method of claim 17, wherein the second etch process is performed in-situ with forming the stressor material, and wherein the second etch process is performed using process gases selected from a group comprising HBr, $SF_6$, $NF_3$, $Cl_2$, $O_2$, Ar, and He.

* * * * *